US011615958B2

(12) United States Patent
Ko (10) Patent No.: US 11,615,958 B2
(45) Date of Patent: Mar. 28, 2023

(54) METHODS TO REDUCE MICROBRIDGE DEFECTS IN EUV PATTERNING FOR MICROELECTRONIC WORKPIECES

(71) Applicant: Tokyo Electron Limited, Tokyo (JP)

(72) Inventor: Akiteru Ko, Albany, NY (US)

(73) Assignee: Tokyo Electron Limited, Tokyo (JP)

(*) Notice: Subject to any disclaimer, the term of this patent is extended or adjusted under 35 U.S.C. 154(b) by 427 days.

(21) Appl. No.: 16/827,928

(22) Filed: Mar. 24, 2020

(65) Prior Publication Data

US 2021/0305048 A1    Sep. 30, 2021

(51) Int. Cl.
| | |
|---|---|
| H01L 21/033 | (2006.01) |
| G02B 1/11 | (2015.01) |
| G03F 7/20 | (2006.01) |
| G02B 1/14 | (2015.01) |

(52) U.S. Cl.
CPC ............ *H01L 21/0337* (2013.01); *G02B 1/11* (2013.01); *G02B 1/14* (2015.01); *G03F 7/2026* (2013.01); *H01L 21/0332* (2013.01)

(58) Field of Classification Search
CPC .......... H01L 21/02282; H01L 21/0332; H01L 21/0335; H01L 21/0337; H01L 21/0338; H01L 21/31116; H01L 21/31144; G02B 1/11; G02B 1/14; G03F 7/2026
See application file for complete search history.

(56) References Cited

U.S. PATENT DOCUMENTS

| | | | |
|---|---|---|---|
| 7,864,426 B2 | 1/2011 | Yun | |
| 2016/0268162 A1 | 9/2016 | Akasaka et al. | |
| 2018/0138036 A1* | 5/2018 | Baldasseroni | .... H01L 21/02219 |
| 2019/0057871 A1* | 2/2019 | Shih | .................. H01L 21/31144 |

FOREIGN PATENT DOCUMENTS

| | | |
|---|---|---|
| KR | 100769142 B1 | 10/2007 |
| WO | 2011090262 A2 | 7/2011 |
| WO | 2017112439 A1 | 6/2017 |

OTHER PUBLICATIONS

Korean Intellectual Property Office, International Search Report and Written Opinion for International application No. PCT/US2020/066531, dated Apr. 26, 2021, 8pp.

* cited by examiner

*Primary Examiner* — Brook Kebede (57) ABSTRACT

Embodiments reduce or eliminate microbridge defects in extreme ultraviolet (EUV) patterning for microelectronic workpieces. A patterned layer is formed over a multilayer structure using an EUV patterning process. Protective material is then deposited over the patterned layer using one or more oblique deposition processes. One or more material bridges extending between line patterns within the patterned layer are then removed while using the protective material to protect the line patterns. As such, microbridge defects caused in prior solutions are reduced or eliminated. For one embodiment, the oblique deposition processes include physical vapor deposition (PVD) processes that apply the same or different protective materials in multiple directions with respect to line patterns within the patterned layer. For one embodiment, the removing includes one or more plasma trim processes. Variations can be implemented.

24 Claims, 7 Drawing Sheets

METHODS TO REDUCE MICROBRIDGE DEFECTS IN EUV PATTERNING FOR MICROELECTRONIC WORKPIECES

BACKGROUND

The present disclosure relates to methods for the manufacture of microelectronic workpieces including the formation of patterned structures on microelectronic workpieces.

Device formation within microelectronic workpieces typically involves a series of manufacturing techniques related to the formation, patterning, and removal of layers of material on a substrate. To meet the physical and electrical specifications of current and next generation semiconductor devices, process flows are being requested to reduce feature size while maintaining structure integrity for various patterning processes.

To achieve reduced feature sizes, patterning using extreme ultraviolet (EUV) lithography has been introduced in processing systems, and this EUV lithography typically uses light having a wavelength from 6 to 16 nanometers (nm) or below. For example, EUV patterning techniques have been introduced into production at sub-7 nm node advanced semiconductor device manufacturing. Although reduced feature sizes are achieved, pattern performance problems have occurred in EUV patterning. With respect to line and space patterns, for example, microbridge defects have occurred in resulting EUV patterns, and these microbridge defects are typically uncorrectable and cause fatal device failures. For example, due to stochastic failure issues, microbridge defects are significant problems for patterning of lines/spaces below a 36 nm pitch. Further, there is often a trade-off in EUV lithography between eliminating microbridge defects and causing broken line defects, which are also undesirable defects that typically cause fatal device failures.

Figure 1A:
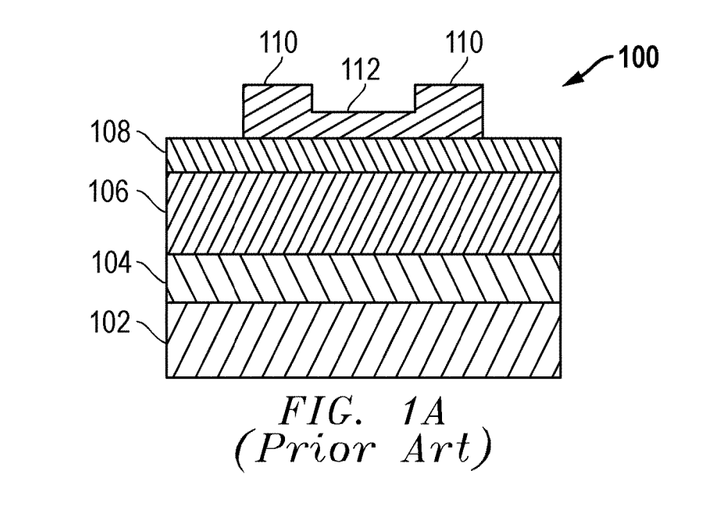
FIGS. 1A-1C (Prior Art) provide example embodiments for a conventional EUV patterning process where microbridge defects result from the EUV patterning.

FIG. 1A (Prior Art) is an example embodiment of a cross-section view 100 after a patterned layer 110 has been formed over a multilayer structure using an EUV patterning process. For the example embodiment shown, the multilayer structure includes a hardmask layer 104, a protective layer 106, and an anti-reflective coating (ARC) layer 108 formed over an underlying layer 102. The underlying layer 102 can be a substrate for a microelectronic workpiece, such as a semiconductor substrate and/or another substrate material or combination of materials. The hardmask layer 104 can be SiN and/or other hardmask material or combination of materials. The protective layer 106 can be a spin-on-carbon (SOC) layer of amorphous carbon, a planarization layer (e.g. organic planarization layer), and/or another planarization or protective material or combination of materials. The ARC layer 108 can be a chemical vapor deposition (CVD) material, a silicon-based spin-on-glass (SOG) layer, and/or another ARC material or combination of materials. The patterned layer 110 can be one or more photoresist materials or combination of photoresist materials that are suitable for use in EUV lithography. The patterned layer can also be a chemically amplified resist (CAR) material, a non-CAR material, a metal oxide resist (MOR) material such as SnOx, ZrO or HfO, and/or other suitable materials. It is assumed that the pattern formed by the patterned layer 110 includes lines and spaces between those lines. Unwanted material of the patterned layer 110 often remain after EUV patterning. For the example shown, such unwanted material extends between two adjacent lines and forms a material bridge 112.

Figure 1B:
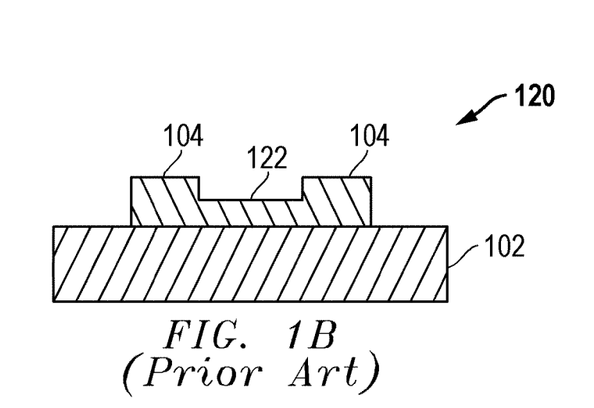

FIG. 1B (Prior Art) is an example embodiment of a cross-section view 120 after the pattern of the patterned layer 110 in FIG. 1A (Prior Art) has been transferred to underlying layers using one or more etch processes. The etch processes can be implemented, for example, as one or more plasma etch process steps, although other etch processes could also be used. For the example embodiment shown, the line/space pattern has been transferred from the patterned layer 110 in FIG. 1A (Prior Art) to the hardmask layer 104. However, the material bridge 112 has also been transferred to the hardmask layer 104 to form a material bridge 122 of the hardmask material that extends between two adjacent lines within the patterned hardmask layer 104.

Figure 1C:
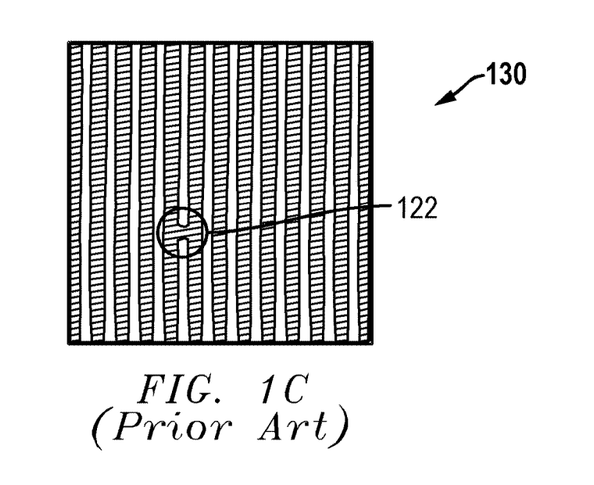

FIG. 1C (Prior Art) is an example embodiment of a top-view 130 of line patterns showing the material bridge 122 formed between two adjacent lines. This material bridge 122 causes a microbridge defect. As indicated above, such microbridge defects are typically uncorrectable and cause fatal device failures in resulting devices formed in the microelectronic workpieces being processed.

SUMMARY

Embodiments are described herein that reduce or eliminate microbridge defects in EUV patterning for microelectronic workpieces. A patterned layer is formed over a multilayer structure using an EUV patterning process. Protective material is then deposited over the patterned layer using one or more oblique deposition processes. One or more material bridges extending between line patterns within the patterned layer are then removed while using the protective material to protect the line patterns. As such, microbridge defects caused in prior solutions are reduced or eliminated. For one embodiment, the oblique deposition processes include physical vapor deposition (PVD) processes that apply the same or different protective materials in multiple directions with respect to line patterns within the patterned layer. For one embodiment, the removing includes one or more plasma trim processes. Different or additional features, variations, and embodiments can also be implemented, and related systems and methods can be utilized as well.

For one embodiment, a method for extreme ultraviolet processing of a microelectronic workpiece is disclosed including forming a patterned layer over a multilayer structure using an extreme ultraviolet (EUV) patterning process, depositing protective material over the patterned layer using one or more oblique deposition processes applied in two or more directions, and removing one or more material bridges extending between line patterns within the patterned layer while using the protective material to protect the line patterns.

In additional embodiments, the protective material has a thickness greater than or equal to 0.1 nanometers and less than or equal to 5.0 nanometers. In further additional embodiments, the removing includes one or more etch processes. In further embodiments, the one or more etch processes include one or more plasma trim processes.

In additional embodiments, the depositing includes a first oblique deposition process in a first direction to deposit a first protective material and a second oblique deposition process in a second direction to deposit a second protective material. In further embodiments, the first protective material and the second protective material are a same material. In further embodiments, the first protective material and the second protective material are different materials from each other or include combinations of materials. In further embodiments, the first protective material and the second protective material each includes at least one of an organic material, oxide, nitride, carbon, silicon, SiO, SiN, SiON, Sn, SnO, Ti, TiO, TiN, Ta, TaN, Al, AlO, Zr, ZrO Hf, HfO, W, or WC.

In additional embodiments, the one or more oblique deposition processes include one or more oblique physical vapor deposition (PVD) processes. In further embodiments, the one or more oblique PVD processes apply the protective material at angles of incidence of 10 to 80 degrees with respect to a horizontal surface of a next underlying layer. In further embodiments, the one or more oblique PVD processes are used to deposit protective material simultaneously in two different directions.

In additional embodiments, a first set of oblique PVD processes is used to deposit protective material in a first direction using one or more angles, and a second set of oblique PVD processes using one or more angles is used to deposit protective material in a second direction. In further embodiments, oblique PVD processes from the first set are alternated with oblique PVD processes from the second set.

In additional embodiments, a plurality of oblique PVD processes are used having a same process chemistry or different process chemistries. In further additional embodiments, a plurality of oblique PVD processes are using having a same target material or different target materials.

In additional embodiments, the one or more material bridges have heights lower than heights for the line patterns within the patterned layer. In further embodiments, the heights of the one or more material bridges above a surface of a next underlying layer upon which the patterned layer is formed is greater than zero and is less than or equal to ninety-five percent of the heights for the line patterns above the next underlying layer.

In additional embodiments, the method includes transferring a pattern of the patterned layer to at least one underlying layer within the multilayer structure. In further embodiments, the multilayer structure includes a hardmask layer formed over a substrate for the microelectronic workpiece, and the pattern is transferred to the hardmask layer. In further embodiments, the method includes performing one or more etch processes to remove the protective material before the transferring.

In additional embodiments, the EUV patterning process includes forming an EUV photoresist layer, exposing the EUV photoresist layer with a pattern using EUV light, and removing unexposed portions of the EUV photoresist layer to form the patterned layer. In further embodiments, the EUV photoresist layer includes at least one of a chemically amplified resist (CAR) material, a non-CAR material, a metal oxide resist (MOR) material, or combination of materials. In further embodiments, the EUV light has a wavelength from 6 to 16 nanometers.

In additional embodiments, the multilayer structure includes an anti-reflective coating (ARC) layer, a protective layer, and a hardmask layer formed over a substrate for the microelectronic workpiece.

Different or additional features, variations, and embodiments can also be implemented, and related systems and methods can be utilized as well.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Methods are disclosed to reduce or eliminate microbridge defects in EUV patterning for microelectronic workpieces. As described herein, oblique deposition processes, such as oblique physical vapor deposition (PVD) processes, apply material that protects patterned layers including sidewalls and corners of line patterns. For one embodiment, oblique PVD processes are applied to lines within patterned photoresist layers such that material bridges between the lines will not receive deposited material from the oblique PVD. The material bridges are then removed, for example, using a plasma trim process. When the resulting pattern is transferred to underlying layers, no transfer of the material bridges occurs becomes these material bridges have previously been removed. As such, microbridge defects are reduced or eliminated without damaging the line patterns. Other advantages and implementations can also be achieved while still taking advantage of the process techniques described herein.

Figure 2A:
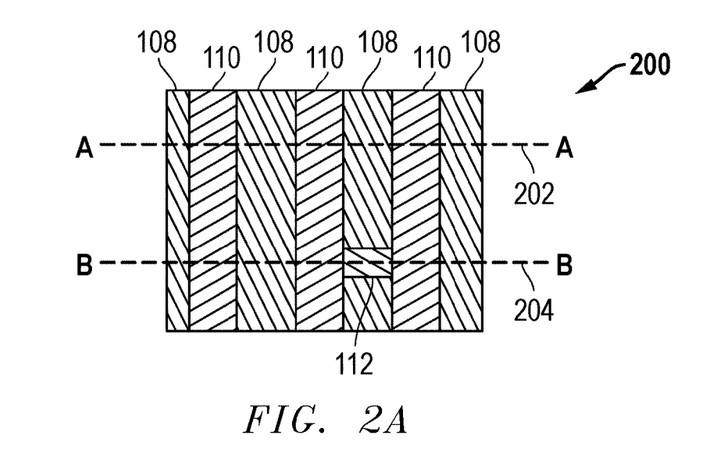
FIGS. 2A-2C provide example embodiments after a patterned layer has been formed over a multilayer structure using an EUV patterning process.
Figure 2B:
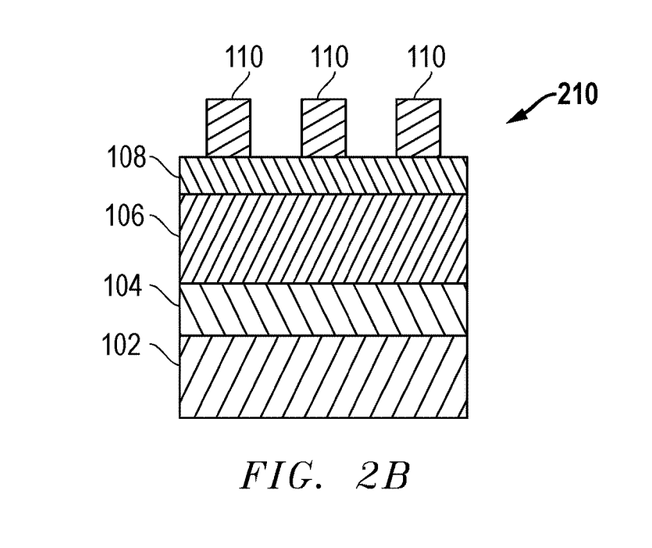
Figure 2C:
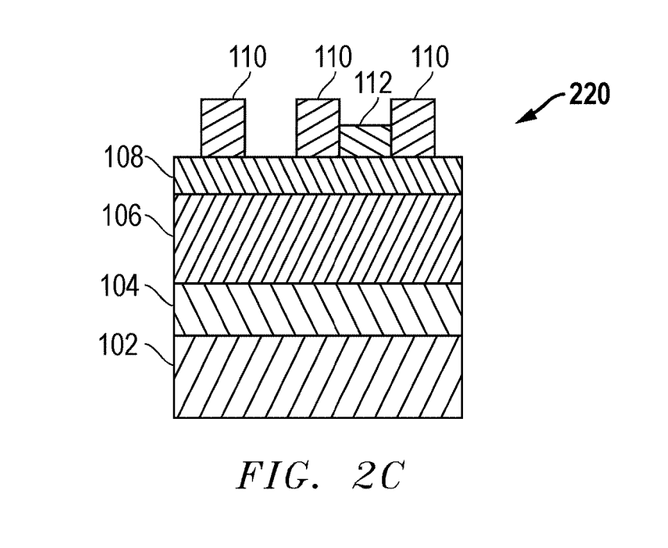

FIGS. 2A-2C provide example embodiments after a patterned layer 110 has been formed over a multilayer structure using an EUV patterning process. As indicated above, EUV lithography can be used to form the patterned layer 110. For example, an EUV photoresist layer can be formed and then exposed to a pattern using EUV light. Unexposed portions of the EUV photoresist layer can then be removed to form the patterned layer 110, for example, using one or more photoresist etch processes.

Looking first to FIG. 2A, an example embodiment of a top view 200 is shown including the patterned layer 110. The patterned layer 110 includes line patterns and adjacent spaces. The underlying ARC layer 108 can be seen through the adjacent spaces. A material bridge 112 extends between two of the lines within the patterned layer 110. Line A-A 202 and line B-B 204 represent locations of the cross-section views in FIG. 2B and FIG. 2C, respectively.

FIG. 2B is an example embodiment of a cross-section view 210 through the line A-A 202 shown in FIG. 2A. For the example embodiment shown, the multilayer structure includes a hardmask layer 104, a protective layer 106, and an ARC layer 108 formed over an underlying layer 102. The underlying layer 102 can be a substrate for a microelectronic workpiece, such as a semiconductor substrate and/or another substrate material or combination of materials. The hardmask layer 104 can be SiN and/or other hardmask material or combination of materials. The protective layer 106 can be a spin-on-carbon (SOC) layer of amorphous carbon, a planarization layer (e.g. organic planarization layer), and/or another planarization or protective material or combination of materials. The ARC layer 108 can be a chemical vapor deposition (CVD) material, a silicon-based spin-on-glass (SOG) layer, and/or another ARC material or combination of materials. The patterned layer 110 can be one or more photoresist materials or combination of photoresist materials that are suitable for use in EUV lithography. The patterned layer can also be a chemically amplified resist (CAR) material, a non-CAR material, a metal oxide resist (MOR) material such as SnOx, ZrO or HfO, and/or other suitable materials. As shown in FIG. 2A, the pattern formed by the patterned layer 110 includes lines and spaces between those lines.

FIG. 2C is an example embodiment of a cross-section view 220 through the line B-B 204 shown in FIG. 2A. This cross-section view 220 is similar to cross-section view 100 in FIG. 1A (Prior Art). As shown, unwanted material of the patterned layer 110 extends between two adjacent lines and forms an undesired material bridge 112. For example, such material bridges are often formed by scum left after the patterning of the patterned layer 110. Typically, the material bridge 112 has a height that is lower than a height for the line patterns within the patterned layer 110. For one example embodiment, the height ($H_{BRDG}$) of the material bridge 112 above the surface of the next underlying layer upon which the patterned layer 110 is formed (e.g., the ARC layer 108 in FIG. 2C) is greater than zero and is less than or equal to ninety-five percent of the height ($H_{PTRN}$) that the patterned layer 110 extends above the next underlying layer, such that $0 < H_{BRDG} \leq (0.95) * H_{PTRN}$. It is noted that the height of the material bridge 112 can vary depending upon the patterns formed in the patterned layer 110 and/or other process parameters.

Figure 3A:
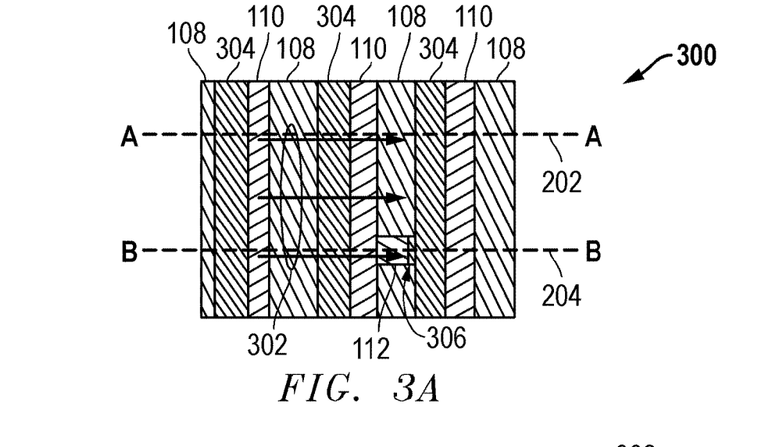
FIGS. 3A-3C provide example embodiments after a first oblique deposition process in a first direction has been used to deposit protective material onto the patterned layer shown in FIGS. 2A-2C.
Figure 3B:
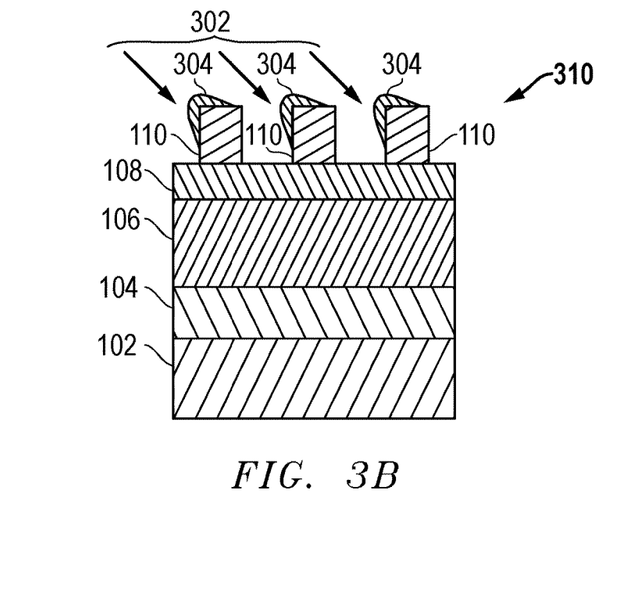
Figure 3C:
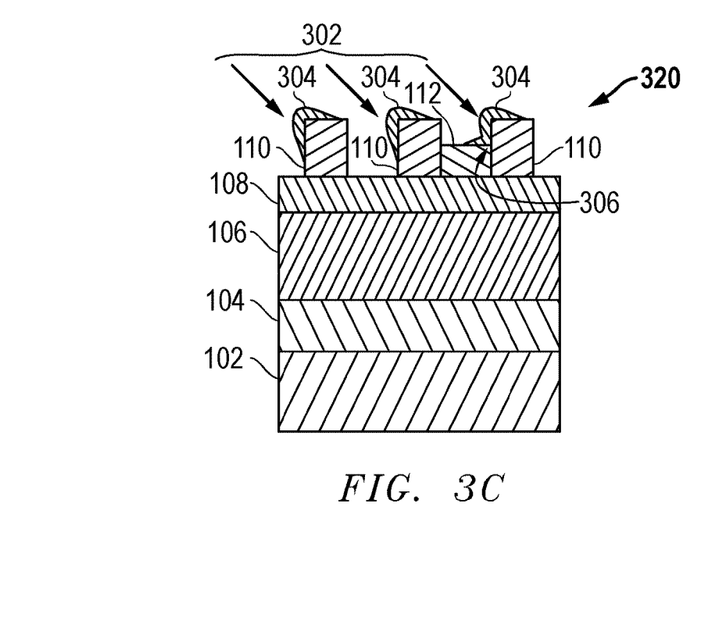

FIGS. 3A-3C provide example embodiments after a first oblique deposition process in a first direction 302 has been used to deposit protective material 304 onto the patterned layer 110, which can include line patterns formed within the patterned layer 110. The protective material 304 can be, for example, oxide, nitride, and/or other protective material although different and/or additional materials can also be used. For example, the protective material 304 can also be a silicon (Si) containing material such as Si, SiO, SiN, and/or SiON; a metal containing material such as Sn, SnO, Ti, TiO, TiN, Ta, TaN, Al, AlO, Zr, ZrO Hf, HfO, W, and/or WC; an organic material such as carbon (C); and/or another suitable material or combination of materials. It is further noted that one or more deposition process steps can be used for the first oblique deposition process to deposit the protective material 304. For one example embodiment, the thickness (T) of the protective material 304 is greater than or equal to 0.1 nm and less than or equal to 5.0 nm, such that 0.1 nm≤T≤5.0 nm. It is noted that other thicknesses could also be used depending upon the patterns formed within the patterned layer 110. It is further noted that the thickness and material used for the protective material 304 can be designed to have enough selectivity to protect the patterns within the patterned layer 110 from erosion during removal of the undesired material bridges 112, and this selection of thickness and material can be independent from the patterns formed within the patterned layer 110 and/or underlying structures.

FIG. 3A is an example embodiment of a top view 300 of the structures in FIG. 2A after material 304 that has been deposited by the first oblique deposition process in a first direction 302. As shown, the protective material 304 is deposited on the sidewalls and corners of the patterned layer 110 exposed to the first direction 302 for the first oblique deposition process. Only a small portion 306 of the protective material is deposited on top of the material bridge 112. Line A-A 202 and line B-B 204 represent locations of the cross-section views in FIG. 3B and FIG. 3C, respectively.

FIG. 3B is an example embodiment of a cross-section view 310 through the line A-A 202 shown in FIG. 3A. As indicated above, the first oblique deposition process in a first direction 302 has deposited protective material 304 on the sidewalls and corners of the patterned layer 110 exposed to direction 302 for this first oblique deposition process.

FIG. 3C is an example embodiment of a cross-section view 320 through the line B-B 204 shown in FIG. 3A. As indicated above, the first oblique deposition process in a first direction 302 has deposited protective material 304 on the sidewalls and corners of the patterned layer 110 exposed to the first direction 302 the first oblique deposition process. As also indicated above, only a small portion 306 of the protective material is deposited on top of the material bridge 112.

Figure 4A:
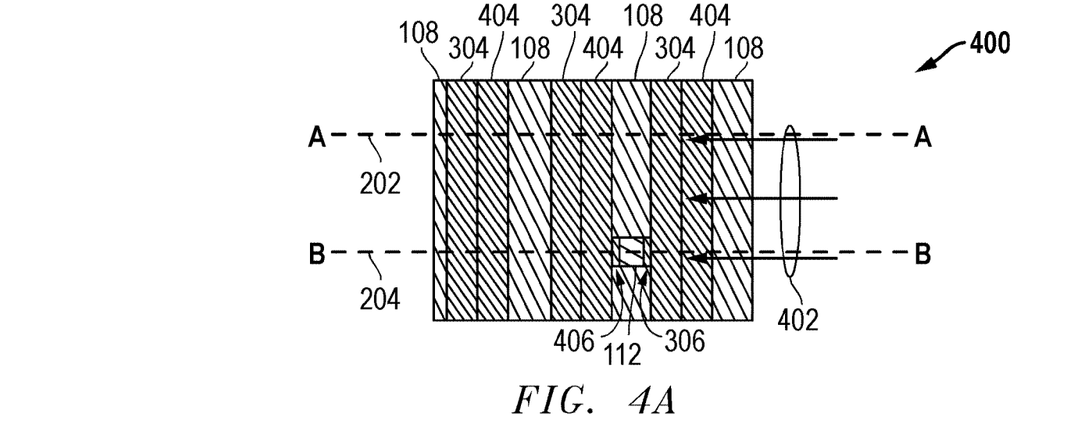
FIGS. 4A-4C provide example embodiments after a second oblique deposition process in a second direction has been used to deposit protective material onto the patterned layer shown in FIGS. 3A-3C.
Figure 4B:
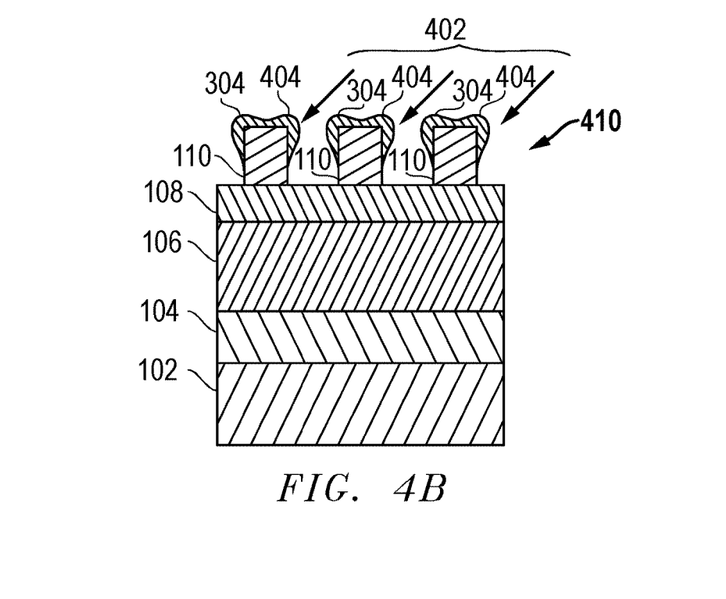
Figure 4C:
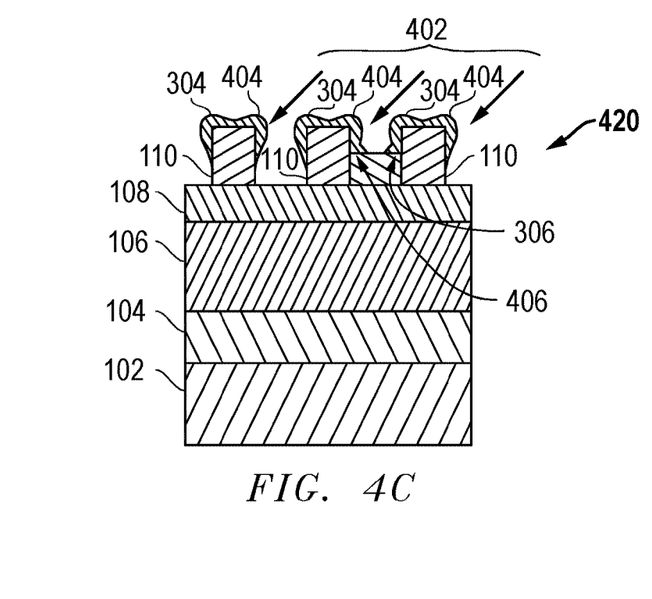

FIGS. 4A-4C provide example embodiments after a second oblique deposition process in a second direction 402 has been used to deposit protective material 404 onto the patterned layer 110, which can include line patterns formed within the patterned layer 110. The protective material 404 can be, for example, oxide, nitride, and/or other protective material although different and/or additional materials can also be used. For example, the protective material 404 can also be a silicon (Si) containing material such as Si, SiO, SiN, and/or SiON; a metal containing material such as Sn, SnO, Ti, TiO, TiN, Ta, TaN, Al, AlO, Zr, ZrO Hf, HfO, W, and/or WC; an organic material such as carbon (C); and/or another suitable material or combination of materials. It is further noted that one or more deposition process steps can be used for the second oblique deposition process to deposit the protective material 404. For one example embodiment, the thickness (T) of the protective material 404 is greater than or equal to 0.1 nm and less than or equal to 5.0 nm, such that 0.1 nm≤T≤5.0 nm. It is noted that other thicknesses could also be used depending upon the patterns formed within the patterned layer 110. It is further noted that the thickness and material used for the protective material 404 can be designed to have enough selectivity to protect the patterns within the patterned layer 110 from erosion during removal of the undesired material bridges 112, and this selection of thickness and material can be independent from the patterns formed within the patterned layer 110 and/or underlying structures.

In addition, the material used for the protective material 404 can be the same or different from the material used for protective material 304, although it is preferably the same material. It is further noted that the protective material 304 and/or the protective material 404 can be a combination of materials that are deposited using multiple oblique deposition processes. For example, the protective material 304 can be a combination of materials formed by multiple oblique deposition processes using different process chemistries. Similarly, the protective material 404 can be a combination of materials formed by multiple oblique deposition processes using different process chemistries. Other variations can also be implemented.

FIG. 4A is an example embodiment of a top view 400 of the structures in FIG. 3A after protective material 404 that has been deposited by the second oblique deposition process in a second direction 402. As shown, the protective material 404 is deposited on the sidewalls and corners of the patterned layer 110 exposed to the second direction 402 for the second oblique deposition process. Only a small portion 406 of the protective material is deposited on top of the material bridge 112. Line A-A 202 and line B-B 204 represent locations of the cross-section views in FIG. 4B and FIG. 4C, respectively.

FIG. 4B is an example embodiment of a cross-section view 410 through the line A-A 202 shown in FIG. 4A. As indicated above, the second oblique deposition process in a second direction 402 has deposited protective material 404 on the sidewalls and corners of the patterned layer 110 exposed to the second direction 402 for the second oblique deposition process.

FIG. 4C is an example embodiment of a cross-section view 420 through the line B-B 204 shown in FIG. 4A. As indicated above, the second oblique deposition process in a second direction 402 has deposited protective material 404 on the sidewalls and corners of the patterned layer 110 exposed to the second direction 402 for second oblique deposition process. As also indicated above, only a small portion 406 of the protective material is deposited on top of the material bridge 112.

It is again noted that the protective material 404 can be the same material as the protective material 304, although different materials could also be used. Further, the oblique deposition processes used to form the protective material 304/404 can be implemented using the same process chemistry or using different process chemistries. It is further noted that the protective material 304/404 is shown as being deposited at different times. However, it is understood that the protective material 304/404 can be deposited at the same time or can be deposited using multiple oblique deposition processes that alternate directions. For example, a first set of oblique deposition processes can be used to deposit the protective material 304 using a first angle or set of angles, and this first set can be alternated with a second set of oblique deposition processes used to deposit the protective material 404 using a second angle or set of angles. Other variations could also be implemented.

For one example embodiment, one or more oblique PVD processes are used for the oblique deposition processes to deposit the protective material 304 shown in FIGS. 3A-3C and to deposit the protective material 404 shown in FIGS. 4A-4C. For one example embodiment, the oblique PVD processes can deposit the protective material 304/404 at an angle of incidence of 10 to 80 degrees (e.g., 10 degrees≤angle of incidence≤80 degrees), and preferably 45 degrees, with respect a horizontal surface of the next underlying layer. It is further noted that because a first direction 302 is used to deposit protective material 304 and a second direction 402 is used to deposit the protective material 404, the first direction 302 can be considered from 10 to 80 degree while the second direction 402 can be considered from 100 to 170 degrees, although the angle of incidence can still be considered from 10 to 80 degrees. In addition, multiple different angles can be used for the oblique deposition processes. For example, multiple different oblique deposition processes can be used with different angles, and/or multiple different angles can be used within a single oblique deposition process to continuously deposit material with moving angles. Other variations could also be implemented.

Although separate oblique PVD processes are shown with respect to FIGS. 3A-3C and FIGS. 4A-4C, it is noted that one or more oblique PVD processes could also be used to apply the protective material 304/404 simultaneously in two or more different directions. Further, as indicated above, oblique PVD processes can be used that alternate directions to build the protective material 304/404 over multiple process cycles. In addition, the oblique PVD processes can be implemented using the same process chemistry or using different process chemistries. Still further, the target material of the oblique deposition processes used to form the protective material 304/404 can also be the same material or different materials. Still further, other oblique deposition processes could also be used instead of or in addition to one or more oblique PVD processes. Other variations can also be implemented while still taking advantage of the techniques described herein.

Figure 5A:
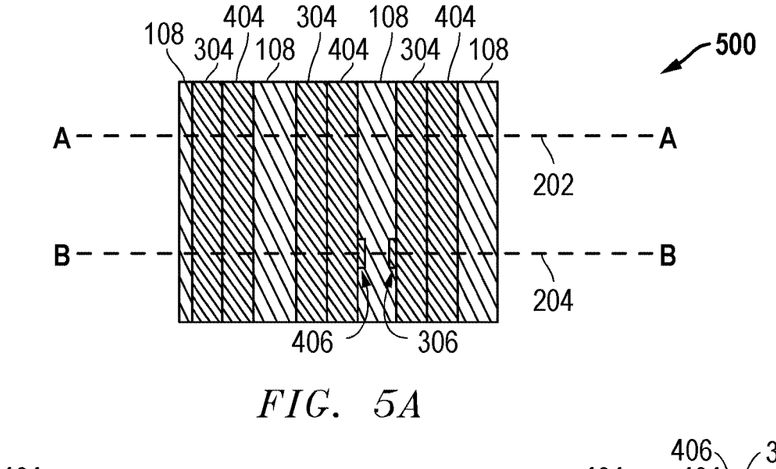
FIGS. 5A-C provide example embodiments after one or more etch processes have been performed to remove material bridges shown in FIGS. 4A-4C.
Figure 5B:
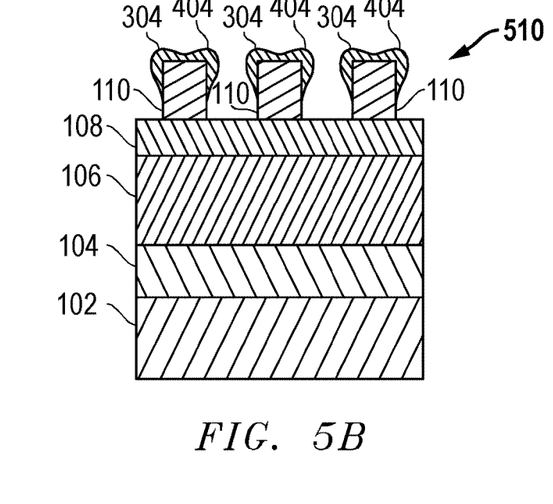
Figure 5C:
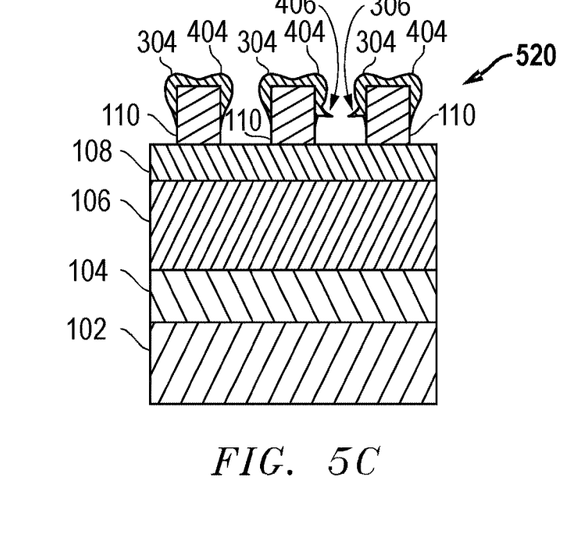

FIGS. 5A-5C provide example embodiments after one or more etch processes have been performed to remove material bridge 112. The etch processes can include one or more plasma trim processes, although additional and/or different etch processes could also be used to remove material bridge 112 and/or other material bridges extending between lines within the line patterns formed within the patterned layer 110.

FIG. 5A is an example embodiment of a top view 500 of the structures in FIG. 4A after the material bridge 112 that has removed, for example, using a plasma trim process. As shown, the protective material 304 and the protective material 404 remain after the removal of the material bridge 112. The portions 306/406 of the protective material deposited on top of the material bridge 112 also remain. Line A-A 202 and line B-B 204 represent locations of the cross-section views in FIG. 5B and FIG. 5C, respectively.

FIG. 5B is an example embodiment of a cross-section view 510 through the line A-A 202 shown in FIG. 5A. As indicated above, any material bridges are removed, and the deposited protective material 304/404 remain on the sidewalls and corners of the patterned layer 110.

FIG. 5C is an example embodiment of a cross-section view 520 through the line B-B 204 shown in FIG. 5A. As indicated above, the material bridge 112 has been removed, and the deposited protective material 304/404 remain on the sidewalls and corners of the patterned layer 110. As also indicated above, the portions 306/406 of the protective material deposited on top of the material bridge 112 also remain after removal of the material bridge 112.

Figure 6:
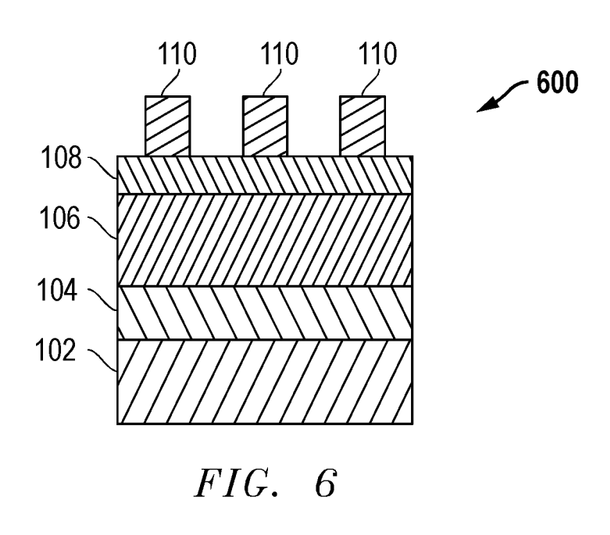
FIG. 6 is an example embodiment after one or more etch processes have been applied to remove the protective material from the structures shown in FIG. 5C.

FIG. 6 is an example embodiment of a cross-section view 600 after one or more etch processes have been applied to remove the protective material 304/404 from the structures shown in FIG. 5C. Because the material bridge 112 was already removed as shown in FIGS. 5A-5C, the desired patterns, such as line patterns and adjacent spaces, remain within the patterned layer 110 after removal of the protective material 304/404.

Figure 7:
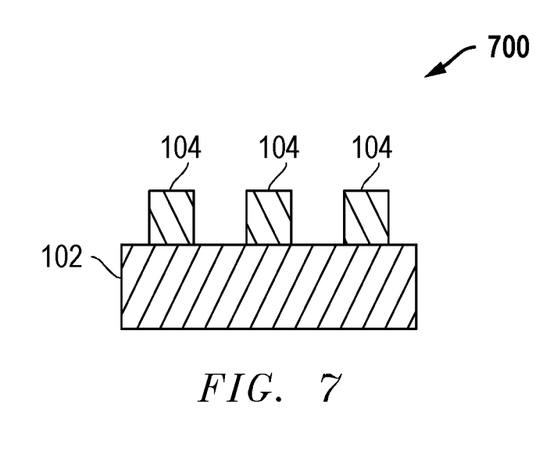
FIG. 7 is an example embodiment after the pattern of the patterned layer in FIG. 6 has been transferred to underlying layers using one or more etch processes.

FIG. 7 is an example embodiment of a cross-section view 700 after the pattern of the patterned layer 110 in FIG. 6 has been transferred to underlying layers using one or more etch processes. As indicated above, the pattern can include line patterns with adjacent space, although other patterns could also be included. The etch processes can be implemented, for example, as one or more plasma etch process steps, although other etch processes could also be used. For the example embodiment shown, the pattern has been transferred to the hardmask layer 104. In contrast with FIG. 1B (Prior Art), the material bridge 112 is not transferred to the hardmask layer 104 because it was previously removed as shown in FIGS. 5A-5C. The desired patterns, such as line patterns and adjacent spaces, remain within the hardmask layer 104. As such, the microbridge defects caused with prior solutions are reduced or eliminated by the oblique deposition techniques described herein.

Figure 8:
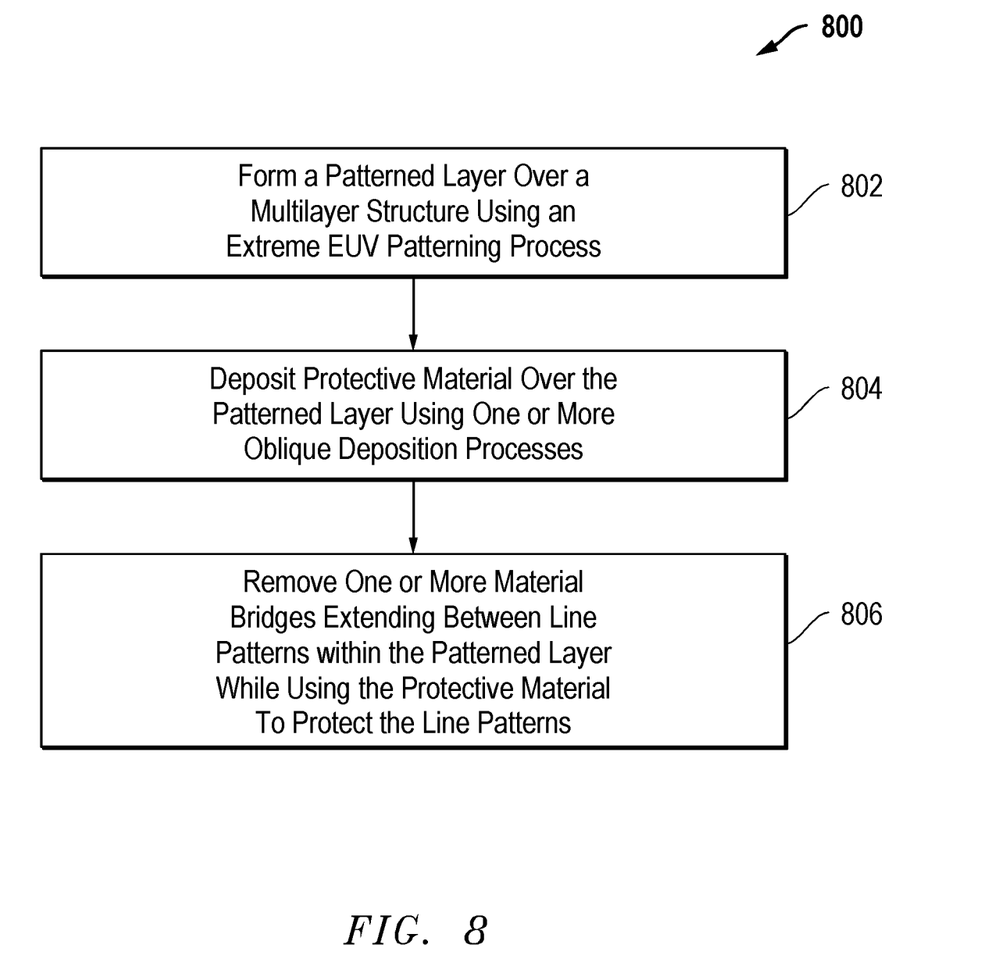
FIG. 8 is a process flow diagram of an example embodiment to apply oblique deposition techniques to EUV patterning processes for microelectronic workpieces as described herein.

FIG. 8 is a process flow diagram 800 of an example embodiment for EUV processing of microelectronic workpieces while reducing or eliminate microbridge defects caused by prior solutions. In block 802, a patterned layer is formed over a multilayer structure using an extreme ultraviolet (EUV) patterning process. In block 804, protective material is deposited over the patterned layer using one or more oblique deposition processes. For example, the one or more oblique deposition processes can be applied in two or more directions to deposit the protective material. For one embodiment, the one or more oblique deposition processes includes one or more PVD processes that apply the same or different protective materials in multiple directions with respect to the line patterns within the patterned layer. In block 806, one or more material bridges extending between line patterns within the patterned layer are removed while using the protective material to protect the line patterns. For one embodiment, the removing includes one or more plasma trim processes. It is noted that additional or different process steps can also be used while still taking advantage of the techniques described herein.

It is noted that one or more deposition processes can be used to form the material layers described herein. For example, one or more depositions can be implemented using chemical vapor deposition (CVD), plasma enhanced CVD (PECVD), physical vapor deposition (PVD), atomic layer deposition (ALD), and/or other deposition processes. For a plasma deposition process, a precursor gas mixture can be used including but not limited to hydrocarbons, fluorocarbons, or nitrogen containing hydrocarbons in combination with one or more dilution gases (e.g., argon, nitrogen, etc.) at a variety of pressure, power, flow and temperature conditions. Lithography processes with respect to PR layers can be implemented using optical lithography, extreme ultraviolet (EUV) lithography, and/or other lithography processes. The etch processes can be implemented using plasma etch processes, discharge etch processes, and/or other desired etch processes. For example, plasma etch processes can be implemented using plasma containing fluorocarbons, oxygen, nitrogen, hydrogen, argon, and/or other gases. In addition, operating variables for process steps can be controlled to ensure that critical dimension (CD) target parameters for vias are achieved during via formation. The operating variables may include, for example, the chamber temperature, chamber pressure, flowrates of gases, frequency and/or power applied to electrode assembly in the generation of plasma, and/or other operating variables for the processing steps. Variations can also be implemented while still taking advantage of the techniques described herein.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate including a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method for extreme ultraviolet processing of a microelectronic workpiece, comprising:
    forming a patterned layer over a multilayer structure using an extreme ultraviolet (EUV) patterning process, the patterned layer including line patterns and one or more material bridges extending between line patterns;
    depositing protective material over the line patterns of the patterned layer using one or more oblique deposition processes applied in two or more directions; and
    removing the one or more material bridges extending between the line patterns within the patterned layer using the protective material to protect the line patterns.

2. The method of claim 1, wherein the protective material has a thickness greater than or equal to 0.1 nanometers and less than or equal to 5.0 nanometers.

3. The method of claim 1, wherein the removing comprises one or more etch processes.

4. The method of claim 3, wherein the one or more etch processes comprise one or more plasma trim processes.

5. The method of claim 1, wherein the depositing comprises a first oblique deposition process in a first direction to deposit a first protective material and a second oblique deposition process in a second direction to deposit a second protective material.

6. The method of claim 5, wherein the first protective material and the second protective material are a same material.

7. The method of claim 5, wherein the first protective material and the second protective material are different materials from each other or comprise combinations of materials.

8. The method of claim 5, wherein the first protective material and the second protective material each comprises at least one of an organic material, oxide, nitride, carbon, silicon, SiO, SiN, SiON, Sn, SnO, Ti, TiO, TiN, Ta, TaN, Al, AlO, Zr, ZrO Hf, HfO, W, or WC.

9. The method of claim 1, wherein the one or more oblique deposition processes comprise one or more oblique physical vapor deposition (PVD) processes.

10. The method of claim 9, wherein the one or more oblique PVD processes apply the protective material at angles of incidence of 10 to 80 degrees with respect to a horizontal surface of a next underlying layer.

11. The method of claim 9, wherein the one or more oblique PVD processes are used to deposit protective material simultaneously in two different directions.

12. The method of claim 9, wherein a first set of oblique PVD processes is used to deposit protective material in a first direction using one or more angles and a second set of oblique PVD processes using one or more angles is used to deposit protective material in a second direction.

13. The method of claim 12, wherein oblique PVD processes from the first set are alternated with oblique PVD processes from the second set.

14. The method of claim 9, wherein a plurality of oblique PVD processes are used having a same process chemistry or different process chemistries.

15. The method of claim 9, wherein a plurality of oblique PVD processes are using having a same target material or different target materials.

16. The method of claim 1, wherein the one or more material bridges have heights lower than heights for the line patterns within the patterned layer.

17. The method of claim 16, wherein the heights of the one or more material bridges above a surface of a next underlying layer upon which the patterned layer is formed is greater than zero and is less than or equal to ninety-five percent of the heights for the line patterns above the next underlying layer.

18. The method of claim 1, further comprising transferring a pattern of the patterned layer to at least one underlying layer within the multilayer structure.

19. The method of claim 18, wherein the multilayer structure comprises a hardmask layer formed over a substrate for the microelectronic workpiece, and wherein the pattern is transferred to the hardmask layer.

20. The method of claim 18, further comprising performing one or more etch processes to remove the protective material before the transferring.

21. The method of claim 1, wherein the EUV patterning process comprises forming an EUV photoresist layer, exposing the EUV photoresist layer with a pattern using EUV light, and removing unexposed portions of the EUV photoresist layer to form the patterned layer.

22. The method of claim 21, wherein the EUV photoresist layer comprises at least one of a chemically amplified resist (CAR) material, a non-CAR material, a metal oxide resist (MOR) material, or combination of materials.

23. The method of claim 21, wherein the EUV light has a wavelength from 6 to 16 nanometers.

24. The method of claim 1, wherein the multilayer structure comprises an anti-reflective coating (ARC) layer, a protective layer, and a hardmask layer formed over a substrate for the microelectronic workpiece.

* * * * *